US007064321B2

(12) United States Patent
Franzen

(10) Patent No.: US 7,064,321 B2

(45) Date of Patent: Jun. 20, 2006

(54) ION FUNNEL WITH IMPROVED ION SCREENING

(75) Inventor: Jochen Franzen, Bremen (DE)

(73) Assignee: Bruker Daltonik GmbH, Bremen (DE)

( * ) Notice: Subject to any disclaimer, the term of this patent is extended or adjusted under 35 U.S.C. 154(b) by 0 days.

(21) Appl. No.: 10/818,778

(22) Filed: Apr. 6, 2004

(65) Prior Publication Data

US 2005/0006579 A1 Jan. 13, 2005

(30) Foreign Application Priority Data

Apr. 8, 2003 (DE) ................................ 103 15 911

(51) Int. Cl.
*H01J 37/301* (2006.01)
*H01J 49/24* (2006.01)

(52) U.S. Cl. ...................... 250/289; 250/293; 250/489; 250/281; 250/288

(58) Field of Classification Search ................. 250/288
See application file for complete search history.

(56) References Cited

U.S. PATENT DOCUMENTS

| | | | | |
|---|---|---|---|---|
| 5,811,800 A | | 9/1998 | Franzen et al. | |
| 6,107,628 A | * | 8/2000 | Smith et al. | 250/292 |
| 6,583,408 B1 | * | 6/2003 | Smith et al. | 250/288 |
| 6,831,274 B1 | * | 12/2004 | Smith et al. | 250/288 |
| 6,891,153 B1 | * | 5/2005 | Bateman et al. | 250/281 |
| 6,949,740 B1 | * | 9/2005 | Sheehan et al. | 250/288 |
| 2002/0175278 A1 | | 11/2002 | Whitehouse | |
| 2004/0195503 A1 | * | 10/2004 | Kim et al. | 250/288 |
| 2005/0269517 A1 | * | 12/2005 | Weiss et al. | 250/396 R |

FOREIGN PATENT DOCUMENTS

| | | | |
|---|---|---|---|
| DE | 196 28 179 | A1 | 7/1996 |
| GB | 2315364 | A | 1/1998 |
| GB | 2370686 | A | 7/2002 |
| GB | 2375653 | A | 11/2002 |
| GB | 2381948 | A | 5/2003 |
| GB | 0407934.9 | | 9/2004 |
| WO | WO 2003/077281 | A1 | 9/2003 |

OTHER PUBLICATIONS

DE Search Report, Dec. 17, 2003.

* cited by examiner

*Primary Examiner*—Nikita Wells

(57) ABSTRACT

An ion funnel screen ions from a gas stream flowing into a differential pump stage of a mass spectrometer, transfers them to a subsequent differential pump stage. The ion funnel uses apertured diaphragms between which gas escapes easily. Holders for the apertured diaphragms are also provided that offer little resistance to the escaping gas while, at the same time, serving to feed the RF and DC voltages.

7 Claims, 2 Drawing Sheets

ION FUNNEL WITH IMPROVED ION SCREENING

FIELD OF THE INVENTION

The invention relates to a so-called ion funnel whose objective is to screen ions from a gas stream flowing into a differential pump stage of a mass spectrometer and to transfer them to the next differential pump stage.

BACKGROUND OF THE INVENTION

In modern mass spectrometers, it is becoming more and more common to use ion sources which generate the ions in pure gases at atmospheric pressure. Electrospray ion sources are one example, but other types, such as atmospheric pressure MALDI (ionization by matrix-assisted laser desorption) have also become commercially available in the meantime. In these types of mass spectrometer with out-of-vacuum ion generation, the ions must initially be introduced into the vacuum system through apertures or capillaries together with a lot of gas; they must then be separated as far as possible from the gas and transported through various differential pump stages to the actual mass separating system, the mass spectrometric ion analyzer.

A combination of inlet capillary, first differential pump stage, skimmer, second differential pump stage and a multipole system for capturing the divergent ions behind the skimmer in the second differential pump stage has been adopted for this purpose, even though this system cannot capture anywhere near all the ions fed into the vacuum. Many ions are already lost in front of the skimmer.

In the first pump stage of the differential evacuation system of commercial mass spectrometers, the task of transferring the ions is undertaken almost exclusively by the stated combination of inflow capillary or inflow aperture with opposing skimmer. The skimmer is conical in shape, in order to deflect the impinging gas outwards, and has a central aperture for the passage of the ions into the next differential pump stage. A suction potential on the skimmer is intended to guide the ions as far as is possible to the central aperture. Many ions are lost at this stage, however, because they are entrained outwards in the outflow lobe of the gas and have no chance of reaching the central aperture in the skimmer to the next chamber.

An ion funnel arrangement has now been elucidated in U.S. Pat. No. 6,107,628 (R. D. Smith and S. A. Shaffer) which screens ions from a gas stream and accurately guides them to the aperture which leads to the next pressure stage of the differential pumping system. The ion yield is considerably higher than when skimmers are used. This ion funnel constitutes a special case of the more general embodiments of ion guide systems in U.S. Pat. No. 5,572,035 (J. Franzen).

The ion funnel consists of a packet of coaxially arranged apertured diaphragms separated by relatively narrow intermediate spaces and arranged with their surfaces parallel, the diameter of the apertures of the apertured diaphragms tapering more and more toward the central outlet hole into the next chamber. A funnel shape is thus formed in the interior of the ion funnel arrangement. The outer shape of the diaphragms usually is a square, with ceramic holding posts and ceramic spacers in the corners of the squares.

The gas is blown into the open funnel by the entrance aperture or by the gas capillary. The wall of the ion funnel is gas permeable because it is formed from the faces of the apertured diaphragms together with the intervening intermediate spaces. The gas escapes through the intermediate spaces between the apertured diaphragms and is pumped away by a vacuum pump. Only a very small amount of gas enters the next chamber of the differential pump arrangement through the very small outlet aperture. The apertured diaphragms are alternately subjected to both phases of an RF voltage (several hundred kilohertz to several megahertz, several hundred volts). This causes the internal wall of the funnel to repel the ions. The method of operation and effect of this repellent "pseudopotential" are described in detail in the cited patent specification U.S. Pat. No. 5,572,035. The pseudopotential prevents the ions from being entrained by the escaping gas stream through the intermediate spaces between the apertured diaphragms. The ions are screened. In addition, the apertured diaphragms are equipped with a stepped DC voltage (a few tens of volts) which utilizes the mobility of the ions to forcibly guide them through the strongly diluted gas in the ion funnel to the outlet hole.

The embodiment of the ion funnel, so far known by publications, is disadvantageous in a number of respects, however. On the one hand, the diaphragms are held by ceramic posts with spacer rings, and the spacer rings and the necessarily large diaphragm area obstruct the stream of escaping gas; the resistors and capacitors soldered onto the outside edge of the diaphragms represent a further obstruction. On the other hand, the ion funnel has a relatively large capacitance with relatively large dielectric losses, making it necessary to have a relatively powerful and hence expensive high frequency generator. Furthermore, the published embodiment has the disadvantage that it only admits a relatively narrow range of the mass-to-charge ratio m/z. The ratios of mass to charge m/z, which are the measured feature in mass spectrometry, are subsequently referred to as "specific masses" for the sake of simplicity.

The transfer of the ions into the next differential pump stages has long been undertaken by so-called ion guides, which normally have the form of radio-frequency carrying multipole systems, i.e. quadrupole, hexapole or octopole systems made of long, thin parallel pole rods. Other types of system have also been elucidated, for example a radio-frequency carrying double helix as described in the previously cited patent specification U.S. Pat. No. 5,572,035.

SUMMARY OF THE INVENTION

The invention improves the ion funnel by designing the apertured diaphragms of the ion funnel to ensure that the gas escapes easily, the holders for the apertured diaphragms to offer as little resistance as possible to the escaping gas and, at the same time, the holders serve to feed the RF and DC voltages. The invention involves making the ring surface area of at least one third of the apertured diaphragms relatively small, and placing the holders which impede the gas stream relatively far outside the rings. This can be achieved by equipping the rings with moderately long external straps leading to the holders. Although one or two straps per ring may be sufficient, the strap leading to one or two holders, it is also possible to use three straps stretching to three holders. Three straps and three holders impart more mechanical stability to the whole structure of the ion funnel. Furthermore, the invention consists of using the holders as voltage feeders as well. Favorably, the holders are small electric boards to which small extensions of the straps are either snapped or soldered or otherwise fastened. It is advantageous if the boards are positioned with their surface radial to the ion funnel so that they offer little resistance to the gas flow. The boards, in turn, conveniently already contain the ion funnel connections with capacitors and resistors which generate the superposition from the stepped DC voltage and both phases of the RF voltage. This creates a structure which is inexpensive to manufacture.

The straps of successive apertured diaphragms can all be mounted onto the boards from the same side, or they can be mounted from alternate sides of the board. In the latter case, the total capacitance of the ion funnel is lower, since straps which are connected with different phases are no longer positioned opposite each other.

The shape of the inner funnel is important to the present invention. The cited U.S. Pat. No. 6,107,628 already describes an exponential decrease of the internal diameter of the apertured diaphragms, but the smallest internal diameter of the apertured diaphragms at the end of the ion funnel quoted there is much too small. The reflective area for the ions is namely not identical with the wall formed by the edges of the apertured diaphragms: the reflective area is a virtual wall in front of the apertured diaphragm wall whose distance from the apertured diaphragm wall increases with decreasing specific mass of the ions. The virtual wall is highly elastic: fast ions can penetrate deeper than slower ones. For ions of medium specific mass (approximately m/z=500 to 1000 atomic mass units per elementary charge) and for a medium RF voltage (around 200 volts at one megahertz), the separation of the virtual reflective wall from the real apertured diaphragm wall is approximately the spatial period of the stacked diaphragms. In the case of ions of lower specific mass it is larger. The smallest diaphragm opening at the end of the ion funnel, therefore, should be at least three times the spatial period of the apertured diaphragms, or possibly even four or five times. Otherwise, light ions cannot pass through to the end of the ion funnel.

The ion funnel is not only useful in the first pump stage; it can also be used in the second pump stage of the differential pumping device. The pressure here is usually in the range $10^{-2}$ to $10^{-1}$ millibars. The previously used method of capturing these ions with a hexapole or octopole rod system involves a loss of ions because faster ions can overcome the pseudopotential barrier between the rods; the utilization of an ion funnel at this point improves the ion capture and enables a better transition to the next pump stage. Two ion funnels in two differential pump stages provide a short and very effective arrangement. The puller lenses, which, in practice, are preferred for the transfer from one pump chamber to the next can be incorporated into the structure of the ion funnel.

BRIEF DESCRIPTION OF THE DRAWINGS

The above and further advantages of the invention may be better understood by referring to the following description in conjunction with the accompanying drawings in which.

DETAILED DESCRIPTION

In modern mass spectrometers, it is becoming more and more common to use ion sources which generate the ions in pure gases at atmospheric pressure. The ions are then usually lead with the pure protective gas through a relatively long capillary (around 160 millimeters long with 500–600 micrometer internal diameter) into the first pump stage of a differential pump unit. Around two to four atmospheric liters of gas per minute are introduced into the vacuum system. Less frequently, simple small apertures of a few hundred micrometers diameter are used instead of the capillaries. Publications and the above cited patent specification describe ion funnels which are used instead of the usual gas skimmer to screen ions from gas streams and to transfer them in a concentrated form. The invention described here relates to an improvement to the ion funnel with respect to high transmission capacity for ions of a wide range of specific masses, easy escape of the gas to achieve a lower pressure inside the funnel, simple manufacture and low manufacturing cost of the ion funnel and its electrical supply unit.

Figure 1:
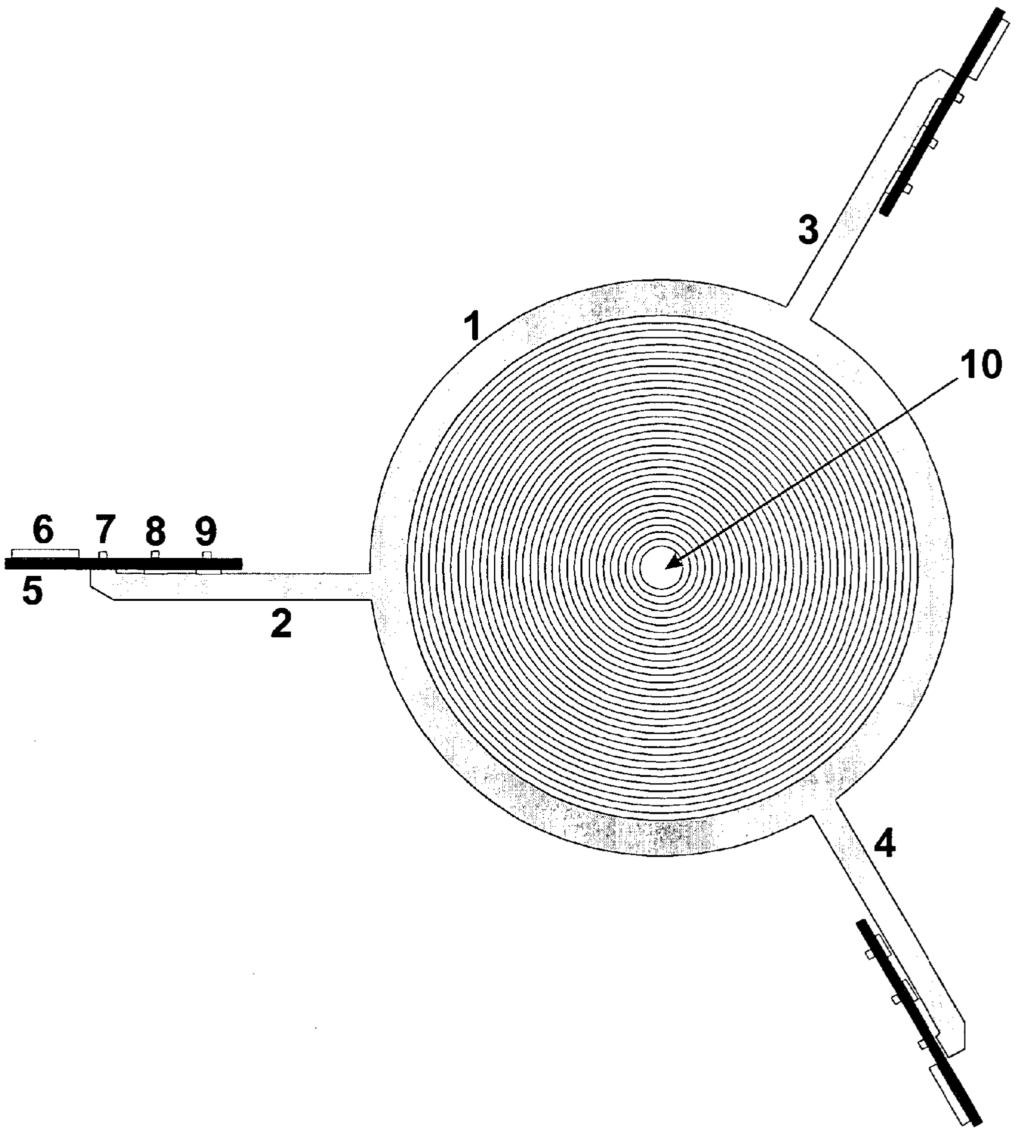
FIG. 1 shows a schematic representation of the ion funnel in plan view.

A first embodiment, as represented in FIG. 1, consists of a packet of around 50 thin apertured diaphragms, each soldered via three closely spaced external straps into three electric boards which serve as holders as well as voltage supplies. An input ring diaphragm (1) carries (as do all the other ring diaphragms) three straps (2, 3, 4) which are soldered to electrical boards (5). The straps of successive rings are of different lengths in order to avoid too dense a positioning of the soldered joints. In FIG. (1) the soldered joints are arranged in three rows (7, 8, 9). In addition, there are resistors or capacitors (6) respectively on the boards. The internal diameters of the rings decrease toward the output, as can be seen in the plan view, and finish with a smallest diameter (10).

The apertured diaphragms are each around 0.5 millimeters thick and spaced around 0.5 millimeters apart. The spatial repetition distance of the apertured diaphragms is thus 1.0 millimeters. The aperture diameters in the apertured diaphragms decrease more and more as the distance from the inlet side increases, thus forming the inner funnel. The funnel is conical on the inlet side with an input aperture of around 40 millimeters; at the output side it adopts more of a short cylindrical shape with a diameter of around four to five millimeters. The total length of the funnel is around 50 millimeters. The apertured diaphragms are alternately connected with both phases of an RF voltage via the three electrical boards. Two of the boards, for example, feed both phases of the RF voltage via chains of capacitors, the third board can contain the voltage dividers for the superimposed DC potential. This creates a DC potential, superimposed onto the RF voltage, which decreases toward the output of the ion funnel such that the ions with the desired polarity are driven toward the output.

The invention is particularly aimed at keeping the gas pressure in the interior of the ion funnel as low as possible and at transferring ions with as wide a range of specific masses as possible into the next chamber of the differential pump stage. To this end the spacings between the apertured diaphragms are indeed narrow, but kept relatively short by means of relatively slender rings. In addition, the ion funnel has a large area by a large number of apertured diaphragms. The resistors and capacitors are shifted a long way outwards in order to discharge the gas flowing into the ion funnel with preferably no flow resistance into the pump. The narrow spacings between the apertured diaphragms give rise to a strongly repellent pseudoforce when a given RF voltage is applied, in order to retain as many of the ions as possible in the ion funnel. Simple and inexpensive manufacture is achieved because the soldering into the electrical boards is the sole means of fixing.

The lower the pressure, i.e. the longer the free paths, and the closer the apertured diaphragms are to each other, the more effective is the repulsion of the ions in the inhomogeneous alternating field on the inside of the funnel wall—particularly for heavier ions. On the other hand, the danger that the ions will be entrained by escaping gas molecules increases when the gaps are narrow and hence the velocities are high; in addition, this causes the internal pressure in the ion funnel to rise. When a given quantity of gas flows in, the entrainment can only be prevented if the internal surface area of the funnel, and hence the number of gaps available for the escape, is large enough. However, the larger the number of apertured diaphragms, the more difficult it is to mount them.

The invention uses the holders for the apertured diaphragms as voltage feeders as well. The holders are narrow electric boards into which small extensions of the straps on the apertured diaphragms are either snapped or soldered. The surfaces of the boards are radial to the ion funnel so that they offer little resistance to the gas flow, as can be seen in FIG. 1. The boards already contain the connections of the ion funnel with capacitors and resistors which generate the superimposition from the stepped DC voltage and both phases of the RF voltage. This creates a structure with low gas flow resistance which is inexpensive to manufacture.

In addition, the invention involves making the ring widths of the apertured diaphragms (1) relatively narrow and positioning the holders, which impede the gas stream, far to the outside. This can be achieved by equipping the ring diaphragms (1) with long external straps (2, 3, 4) which lead to the holders. It is preferable if three straps can be affixed, reaching to three holders; this imparts a high degree of mechanical stability to the complete structure of the ion funnel.

The straps of successive apertured diaphragms can all be mounted into the boards from the same side, or they can be mounted from alternate sides of the board. In the latter case, the total capacitance of the ion funnel is lower, since straps which are connected with different phases are no longer positioned opposite each other.

The apertured diaphragms with their straps can easily be manufactured with modern laser cutting machines. They can also be punched if mass production is required. The apertured diaphragms can be etched to remove the burrs. To avoid charging, vapor-depositing with suitable materials such as titanium nitride or silicon nitride can be carried out. Such vapor-depositing can also enable the use of sheet materials which normally would not be used for the apertured diaphragms because of the danger that their oxide layers would become charged, for example aluminum.

The shape of the inner funnel is important. Most importantly, the smallest internal diameter of the apertured diaphragms at the end of the ion funnel must not be made too small. This is because the reflective area for the ions is not identical with the wall formed by the inner edges of the apertured diaphragms, instead, the reflective area is a virtual wall in front of the apertured diaphragm wall. The virtual wall is further away from the apertured diaphragm wall the lower the specific mass of the ions. The virtual wall is a pseudopotential which quickly falls off from the edge. This virtual wall for ions is highly elastic: fast ions can penetrate deeper than slower ones. For ions of medium specific mass, the separation of the virtual reflective wall from the real apertured diaphragm wall is approximately one spatial period of the diaphragms. The spacing is also dependent on the voltage and the frequency of the RF voltage on the apertured diaphragms. It is larger for ions of lower specific mass than for those of higher specific mass. As a consequence, the smallest diaphragm opening at the end of the ion funnel must be at least three times, better four to five times, the repetition distance of adjacent apertured diaphragms. Otherwise, it is impossible for ions of lower specific mass to pass into the output of the ion funnel; the ion funnel would then not have achieved its purpose.

At the end of the actual ion funnel, a puller lens can also be integrated into the structure to transfer the ions into the next chamber of the differential pump system. The puller lens consists preferably of three apertured diaphragms; across the middle apertured diaphragm is the suction potential for the ions. This pulling potential reaches through the aperture of the first puller lens apertured diaphragm and pulls the ions out of the funnel. The accelerated ions are catapulted through the aperture in the third puller lens apertured diaphragm, and they are decelerated again by the DC potential on the third puller lens apertured diaphragm. One of the three puller lens apertured diaphragms forms the chamber wall to the next differential pump stage. The aperture diameters in the puller lens apertured diaphragms are preferably around one third to two thirds of the aperture diameter of the last apertured diaphragm of the ion funnel. The puller lens diaphragms no longer belong to the ion funnel; they are subject to DC potentials only, whereas all the apertured diaphragms of the ion funnel also carry RF voltages. The apertured diaphragms of the puller lens can also be fastened by means of straps to the holder boards, which supply them with their DC potentials.

Figure 3:
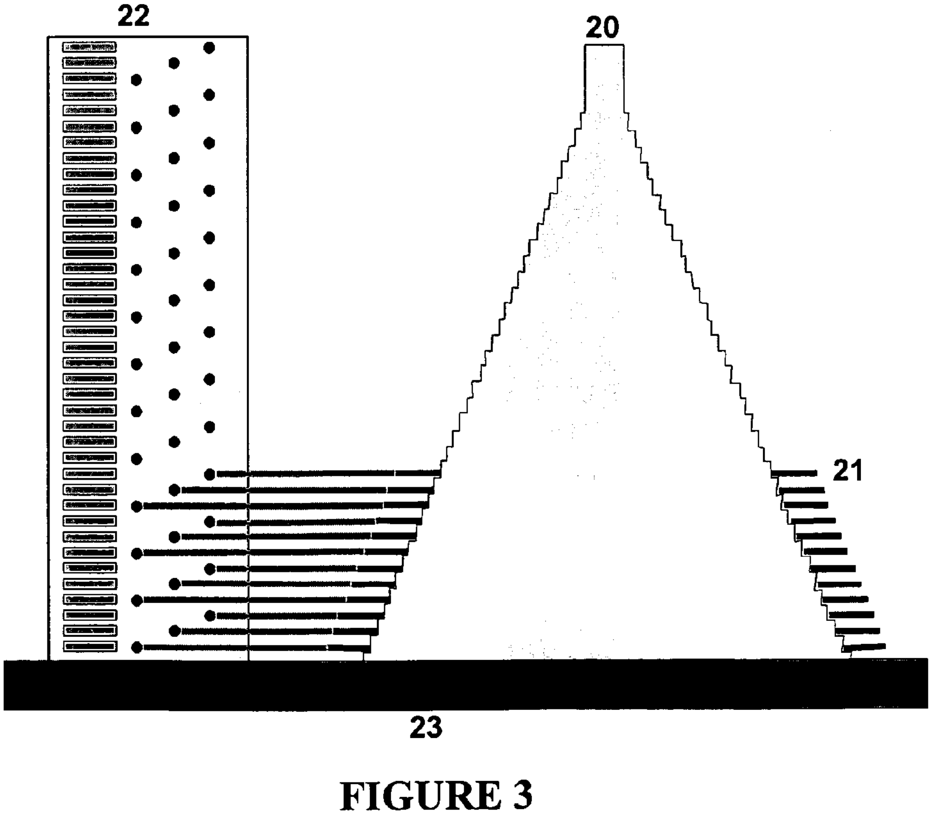
FIG. 3 shows a mounting aid including a stepped cone (20) that houses the apertured diaphragms (21). This enables the straps of the apertured diaphragms to be easily introduced into the soldering holes of the board (22) and soldered there.

Alternating straps of different lengths make it easier to solder the straps into the boards because the soldered joints are not as close to each other. Successive apertured diaphragms can have straps of different lengths or it is also possible that each individual apertured diaphragm has three straps each of a different length and is attached at a staggered rotation of 120°. A stepped cone (20) can be used as a simple mounting aid, as can be seen in FIG. 3. The mounting aid and the boards (22) can be attached to a base (23).

Figure 2:
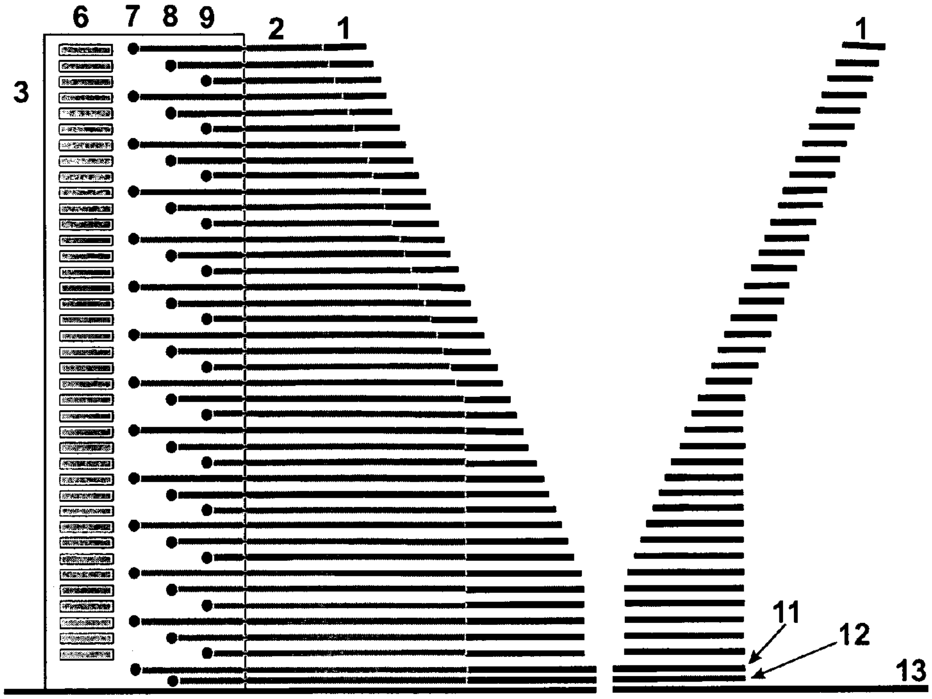
FIG. 2 shows the ion funnel from FIG. 1 in a schematic cross-section.

Ions of high specific mass are held better in the center of the outflow lobe of the input capillary for the gas than are ions of low specific mass. Ions of higher specific mass thus only impinge on the virtual funnel wall in the vicinity of the funnel output. Since the repellent force of the pseudopotential is much weaker for ions of high specific mass than for those of low specific mass, and heavier ions are much more easily entrained by the gas as a result of viscous friction, it is beneficial to restrict the gas flow more through the intermediate spaces of the apertured diaphragms in the vicinity of the funnel output. This can be achieved by using wider rings at the funnel output, as can be seen in FIG. 2. Rings with a larger outer diameter toward the output of the funnel are better at keeping ions of high specific mass in the ion funnel.

As shown in FIG. 2, the rings of the diaphragms (1) are narrow, and only become a little wider toward the output of the funnel in order to produce a lower velocity of the escaping gas in the vicinity of the output. The ring diaphragms are soldered onto the board (5) by means of straps (2), each successive apertured diaphragm possessing straps of different lengths, which are soldered in three rows (7, 8, 9) of soldered joints. Row (6) represents electrical components of the board. On the output side, an ion puller lens, comprised of apertured diaphragms (11), (12) and the chamber wall (13) with the aperture to the next differential pump stage, is integrated at this point. The two apertured diaphragms (11) and (12) are also fastened to the holding boards by means of straps; however, they are not subjected to RF voltage, but only DC voltages in order to transfer the ions into the next chamber.

Until now, an ion funnel has only been employed in the first differential pump stage. The ions were then transferred in a second differential pump stage by a hexapole or octopole rod system. With this method, however, faster ions can easily overcome the pseudopotential wall between the rods and leave the rod system. These ions are then lost to further analyses. It is therefore better to employ an ion funnel in the second pump stage as well. This ion funnel can be a short one, and it may contain an integrated ion puller lens, too. This second ion funnel generates highly collimated ion beams for injection into the third differential pump stage.

Two ion funnels in two differential pump stages produce a short and very effective arrangement because the ions in the second pump stage are also captured very efficiently—practically loss-free.

While the invention has been shown and described with reference to select embodiments thereof, it will be recognized that various changes in form and detail may be made herein without departing from the spirit and scope of the invention as defined by the appended claims.

What is claimed is:

1. An ion funnel, comprising a stack of parallel, coaxially arranged ring-shaped apertured diaphragms with tapering internal diameter, contacted by RF and DC voltages, wherein the smallest internal diameter of the apertured diaphragms is greater than three times the spatial repetition distance of the apertured diaphragms at the output of the ion funnel.

2. An ion funnel according to claim 1, wherein an ion puller lens connected to DC voltages only is integrated into the structure of the ion funnel at its output, one of the apertured diaphragms of the puller lens forming the chamber wall to the next differential pump stage.

3. An ion funnel according to claim 2, wherein the internal diameters of the apertures of the ion puller lens amount to around one third to two thirds of the internal diameter of the apertured diaphragms on the output side of the ion funnel.

4. An ion funnel according to claim 1, wherein the ion funnel is used in a second pumping stage behind a first ion funnel located in a first differential pump stage.

5. An ion funnel according to claim 1, wherein the external diameter of at least one third of the apertured diaphragms is tapered.

6. An ion funnel according to claim 5, wherein the apertured diaphragms are equipped with external straps, the straps being attached to electric boards containing electrical components required for superposition of the RF voltage and the DC voltage, the boards serving as holders as well as voltage suppliers for the apertured diaphragms.

7. An ion funnel according to claim 6, wherein the electric boards are arranged parallel to the radially escaping gas flow.

* * * * *